United States Patent
Tseng et al.

(10) Patent No.: US 10,074,547 B2
(45) Date of Patent: Sep. 11, 2018

(54) PHOTORESIST NOZZLE DEVICE AND PHOTORESIST SUPPLY SYSTEM

(71) Applicant: Taiwan Semiconductor Manufacturing Co., Ltd., Hsin-Chu (TW)

(72) Inventors: Kuo-Shu Tseng, New Taipei (TW); You-Feng Chen, Taichung (TW); Yen-Yu Chen, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 80 days.

(21) Appl. No.: 14/135,017

(22) Filed: Dec. 19, 2013

(65) Prior Publication Data
US 2015/0179483 A1    Jun. 25, 2015

(51) Int. Cl.
   *H01L 21/67* (2006.01)
(52) U.S. Cl.
   CPC .............................. *H01L 21/6715* (2013.01)
(58) Field of Classification Search
   CPC ....... B05B 7/24; H01L 21/67; H01L 21/6715; H01L 21/67017
   USPC ..... 239/589; 118/52, 56, 319, 320, 611, 694
   See application file for complete search history.

(56) References Cited

U.S. PATENT DOCUMENTS

| | | | | | |
|---|---|---|---|---|---|
| 5,565,034 A | * | 10/1996 | Nanbu | ............... | H01L 21/67173 118/319 |
| 5,688,322 A | * | 11/1997 | Motoda | ................... | G03F 7/162 118/319 |
| 5,863,328 A | * | 1/1999 | Sichmann | ............... | B05B 15/10 118/319 |
| 6,062,442 A | * | 5/2000 | Yang | ................... | H01L 21/6715 118/319 |
| 6,165,270 A | * | 12/2000 | Konishi | .................. | B05C 11/08 118/313 |
| 6,332,924 B1 | * | 12/2001 | Shim | ....................... | F16K 23/00 118/319 |
| 6,872,256 B2 | * | 3/2005 | Kitano | ...................... | G03F 7/16 118/302 |
| 7,357,842 B2 | * | 4/2008 | Ishikawa | ................ | G03B 27/32 118/50 |
| 2003/0180471 A1 | * | 9/2003 | Takekuma | ........ | H01L 21/67253 430/271.1 |

(Continued)

FOREIGN PATENT DOCUMENTS

| | | |
|---|---|---|
| JP | 07-211625 | 8/1995 |
| JP | 08-279451 | 10/1996 |

(Continued)

OTHER PUBLICATIONS

Office Action dated Oct. 23, 2015, issued in application No. KR 10-2014-0095655.

(Continued)

*Primary Examiner* — Chee-Chong Lee
(74) *Attorney, Agent, or Firm* — Haynes and Boone, LLP

(57) ABSTRACT

Embodiments of a photoresist supply system including a photoresist nozzle device are provided. The photoresist nozzle device includes a tube including a first segment, a curved segment connected to the first segment, and a second segment connected to the curved segment. The photoresist nozzle device also includes a nozzle connected to the second segment.

12 Claims, 5 Drawing Sheets

(56) References Cited

U.S. PATENT DOCUMENTS

2006/0162748 A1* 7/2006 Lee .................. H01L 21/67034
　　　　　　　　　　　　　　　　　　　134/95.2
2008/0087615 A1* 4/2008 Taniguchi ............... G03F 7/162
　　　　　　　　　　　　　　　　　　　210/805
2008/0251107 A1 10/2008 Osada et al.

FOREIGN PATENT DOCUMENTS

| KR | 10-2006/0059562 | 6/2006 |
| KR | 10-2006-0059562 | 6/2006 |
| KR | 10-2008-0034077 | 4/2008 |

OTHER PUBLICATIONS

Korean language office action dated May 26, 2016, issued in application No. KR 10-2014-0095655.
English language translation of office action dated May 26, 2016, issued in application No. KR 10-2014-0095655.

* cited by examiner

PHOTORESIST NOZZLE DEVICE AND PHOTORESIST SUPPLY SYSTEM

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

In the lithography process, a photoresist is applied to a wafer. The photoresist is a material that forms a pattern when it is exposed to radiation. A thin layer of the photoresist is spread on the surface of a wafer, and the photoresist is exposed to a pattern for a step in the semiconductor manufacturing process. These patterns now have very fine details, and some issues in the photoresist may cause an unsatisfactory image in the exposed photoresist. Although existing devices and methods for lithography process have been generally adequate for their intended purposes, they have not been entirely satisfactory in all respects. Consequently, it would be desirable to provide a solution for photoresist for use in an wafer process apparatus

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. It is understood that additional operations can be provided before, during, and after the method, and some of the operations described can be replaced or eliminated for other embodiments of the method.

Figure 1:
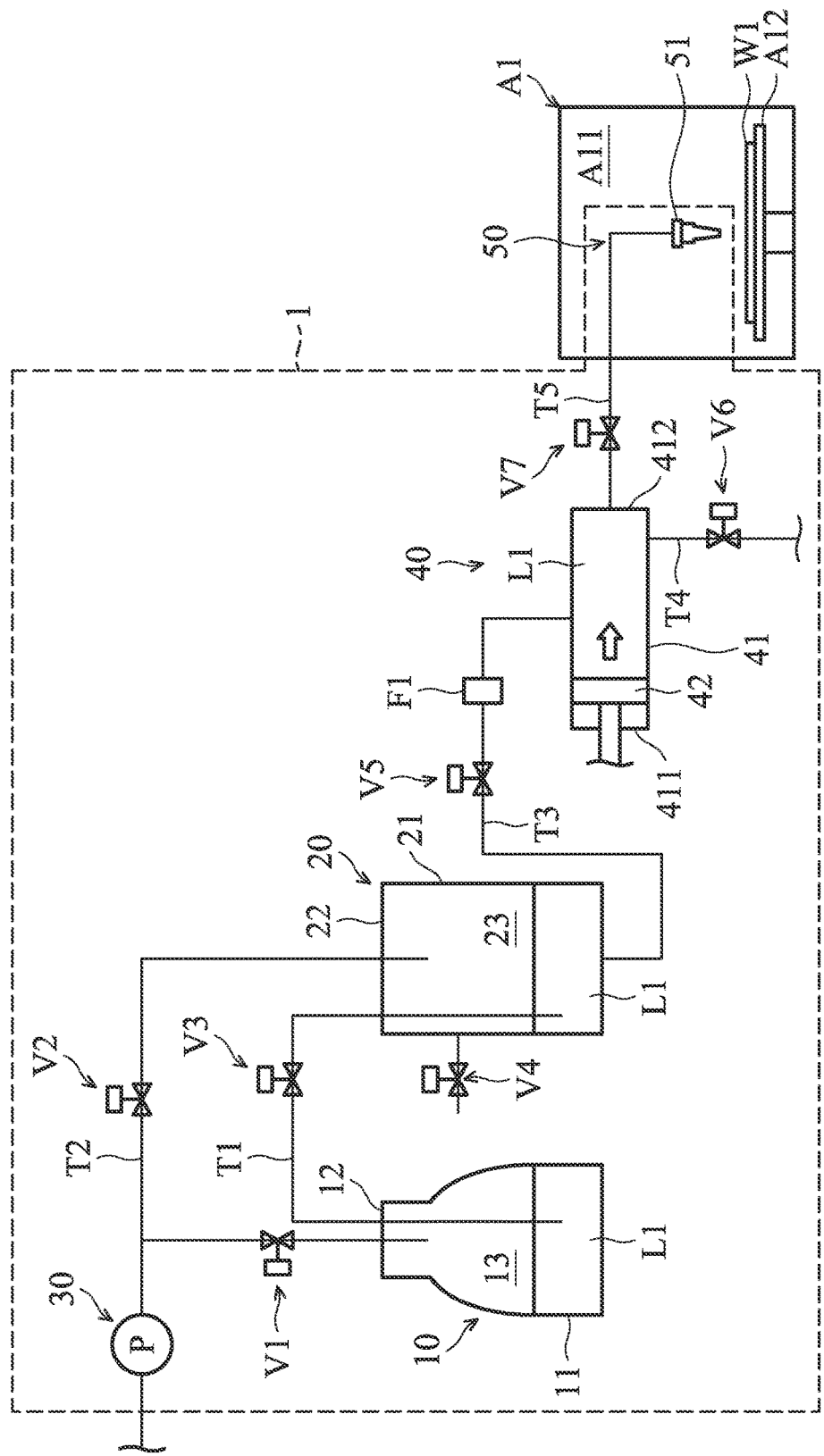
FIG. 1 is a schematic view of a photoresist supply system and a coating apparatus in accordance with some embodiments of the disclosure.

FIG. 1 is a schematic view of a photoresist supply system 1 and a coating apparatus A1 in accordance with some embodiments of the disclosure. The photoresist supply system 1 is configured to supply photoresist fluid L1 to the coating apparatus A1. The photoresist supply system 1 includes a photoresist container 10, a buffer tank 20, a gas pump 30, a pump 40, and a photoresist nozzle device 50.

The photoresist container 10 is configured to contain the photoresist fluid L1. The photoresist container 10 is coupled with the buffer tank 20, and transferring the photoresist fluid L1 to the buffer tank 20. The photoresist container 10 includes a bottle 11 and a seal cap 12 disposed on a top opening of the bottle 11. The bottle 11 and the seal cap 12 form a first sealed chamber 13. The photoresist fluid L1 is contained in the first sealed chamber 13. The photoresist container 10 is replaceable with a new photoresist container 10 in the photoresist supply system 1 when the bottle 11 is empty.

The buffer tank 20 is also configured to contain the photoresist fluid L1. The buffer tank 20 receives the photoresist fluid L1 from the photoresist container 10. When the bottle 11 is empty, the photoresist supply system 1 continually supplies the photoresist fluid L1 to the coating apparatus A1 via the buffer tank 20. In some embodiments, the volume of the buffer tank 20 is greater than the volume of the photoresist container 10.

The buffer tank 20 includes a tank body 21 and a seal cover 22 disposed on a top opening of the tank body 21. The tank body 21 and the seal cover 22 form a second sealed chamber 23. The photoresist container 10 and the buffer tank 20 are coupled with each other by a first tube T1. The first tube T1 is inserted into the bottle 11 by passing through the seal cap 12. One end of the first tube T1 is immersed in the photoresist fluid L1 in the bottle 11. The first tube T1 is further inserted into the tank body 21 by passing through the seal cover 22. One end of the first tube T1 is immersed in the photoresist fluid L1 in the tank body 21.

A gas pump 30 is configured to transfer a gas into the photoresist container 10 and the buffer tank 20. In some embodiments, the gas includes $N_2$. The gas pump 30 is coupled with the photoresist container 10 and the buffer tank 20 by a second tube T2. The second tube T2 is inserted into the bottle 11 by passing through the seal cap 12. One end of the second tube T2 is located in the first sealed chamber 13 and located over the photoresist fluid L1 in the bottle 11. The second tube T2 is also inserted into the tank body 21 by passing through the seal cap 12. One end of the second tube T2 is located in the second sealed chamber 23 and located over the photoresist fluid L1 in the tank body 21. In some embodiments, the gas pump 30 is coupled with the photoresist container 10 by one tube and coupled with the buffer tank 20 by another tube.

When the gas is transferred into the photoresist container 10 by the gas pump 30, the pressure of the first sealed chamber 13 in the photoresist container 10 is increased. Therefore, the photoresist fluid L1 in the photoresist container 10 flows into the buffer tank 20 via the first tube T1. The volume of the photoresist fluid L1 in the photoresist container 10 flowing into the buffer tank 20 is relative to the volume of the gas transferred into the photoresist container 10. For example, the gas pump 30 transfers 5 ml gas into the bottle 11, and 5 ml photoresist fluid L1 flows to the buffer tank 20.

Furthermore, when the gas is transferred into the buffer tank 20, the pressure of the second sealed chamber 23 in the buffer tank 20 is increased. Therefore, the photoresist fluid L1 in the buffer tank 20 flows into the pump 40. The volume of the photoresist fluid L1 in the buffer tank 20 flowing into the pump 40 is relative to the volume of the gas and the photoresist fluid L1 transferred into the buffer tank 20. For example, 3 ml gas and 3 ml photoresist fluid L1 is transferred into the tank body 21, and 6 ml photoresist fluid L1 flows to the pump 40.

In some embodiments, a first valve V1 is disposed on the second tube T2. The first valve V1 controls the flow rate of the gas flowing in to the photoresist container 10. In some embodiments, a second valve V2 is disposed on the second tube T2. The second valve V2 controls the flow rate of the gas flowing in to the buffer tank 20. Further, by the first valve V1 and the second valve V2, the gas pump 30 is configured to selectively supply the gas to the photoresist container 10 or the buffer tank 20.

For example, if the bottle 11 is empty and the photoresist container 10 should be replaced, the first valve V1 is closed and the gas pump 30 transfers the gas to the buffer tank 20. Furthermore, a third valve V3 is disposed on the tube T1. The third valve V3 is closed when the gas pump 30 transfers gas to the buffer tank 20, and the photoresist fluid L1 is prevented from being exhausted from the first tube T1. Therefore, the photoresist supply system 1 should continually supply the photoresist fluid L1 to the coating apparatus A1.

In addition, when the photoresist fluid L1 in the buffer tank 20 is low, the second valve V2 is closed and the gas pump 30 transfers gas to the photoresist container 10. Furthermore, a fourth valve V4 disposed on the tank body 21, and the gas in the tank body 21 can be exhausted via the valve V4. Therefore, the photoresist fluid L1 can fill with the tank body 21 via the first tube T1, when the fourth valve V4 is opened.

The pump 40 receives the photoresist fluid L1 from the buffer tank 20. In some embodiments, the pump 40 is a piston pump. The pump 40 is configured to supply a volume of the photoresist fluid L1 to the coating apparatus A1. For example, the volume is in a range from about 0.5 ml to about 8.0 ml according to different semiconductor manufacturing processes.

The pump 40 includes a cylinder 41 and a piston 42. The cylinder 41 contains photoresist fluid L1. The piston 42 is movably disposed in the cylinder 41. When the piston 42 is moved from a first side 411 of the cylinder 41 toward a second side 412 of the cylinder 41 in a distance, the piston 42 pushes the photoresist fluid L1 to the photoresist nozzle device 50. The distance is relative to the volume and the size of the cylinder 41. For example, the volume is about 5 ml, and the distance is about 10 mm. After the piston 42 pushes the photoresist fluid L1 to the photoresist nozzle device 50, the piston 42 is moved back toward to the first side 411 of the cylinder 41, and the cylinder 41 is filled with the photoresist fluid L1 transferred from the buffer tank 20.

In some embodiments, the pump 40 is coupled with the buffer tank 20 via a third tube T3. The third tube T3 is communicated with the second sealed chamber 23 and the cylinder 41. One end of the third tube T3 is disposed on the bottom of the tank body 21. The other end of the third tube T3 is disposed on a side wall of the cylinder 41.

A fifth valve V5 is disposed on the third tube T3. The fifth valve V5 is closed when the piston 42 pushes the photoresist fluid L1 to the photoresist nozzle device 50. The fifth valve V5 is opened after the piston 42 pushes the photoresist fluid L1 to the photoresist nozzle device 50 and the piston 42 is moved back toward to the first side 411 of the cylinder 41.

In some embodiments, the photoresist fluid L1 is made by mixing resin, light sensitive agent, and solvent. Since the photoresist fluid L1 is viscous, some bubbles and gas are included in the photoresist fluid L1 during the mixing process. In general, the photoresist container 10 filled with photoresist fluid L1 is obtained from a factory. Some bubbles B1 usually remains in the photoresist fluid L1 of the photoresist container 10. Therefore, a filter F1 is disposed on the third tube T3 to remove almost all of the bubbles B1 before the photoresist fluid flows into the cylinder 41. Moreover, since the photoresist fluid L1 is exhausted from the photoresist container 10 and the buffer tank 20 by the gas, some gas is dissolved in the photoresist fluid L1.

Since some of the bubbles B1 may not be removed by the filter F1 and enter into the cylinder 41, a fourth tube T4 is disposed on a side wall of the cylinder 41, and a sixth valve V6 is disposed on the fourth tube T4. After a predetermined number of times (such as three thousands times) of the piston 42 pushing the photoresist fluid L1 to the photoresist nozzle device 50, the sixth valve V6 is opened and some of the photoresist fluid L1 are exhausted from the cylinder 41. The photoresist fluid L1 exhausted from the cylinder 41 is to be checked for the presence of the bubbles B1.

If there are bubbles B1 in the photoresist fluid L1, the filter F1 should be replaced. Since the bubbles B1 are also generated due to some parts of the photoresist supply system 1, such as the valves, the valves also should be checked. However, the time for checking the photoresist fluid L1 is long. For example, a checking process of the photoresist fluid L1 is performed after the piston 42 pushes the photoresist fluid L1 to the photoresist nozzle device 50 the predetermined number of times. Some bubbles B1 may be transferred to the coating apparatus A1 between two checking processes.

Figure 2:
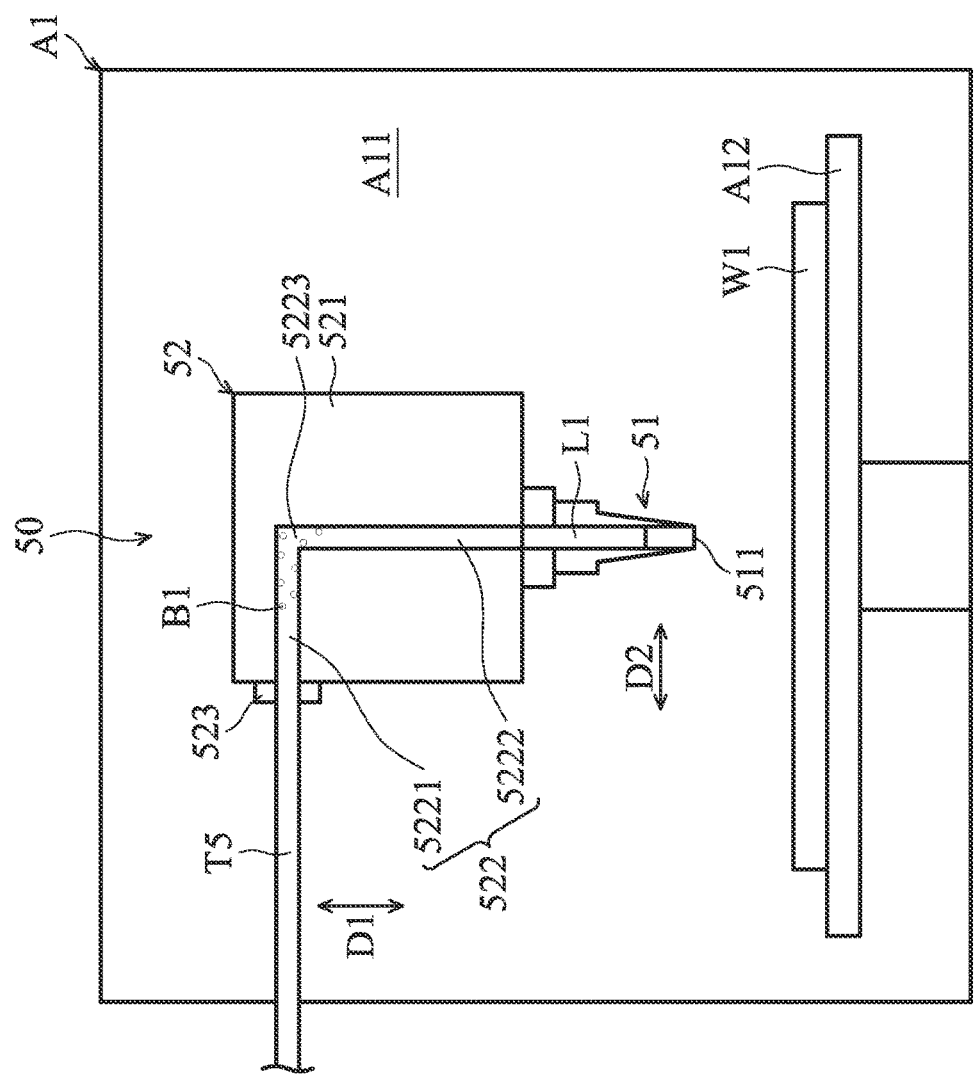
FIG. 2 is a schematic view of a photoresist nozzle device and a coating apparatus in accordance with some embodiments of the disclosure.

FIG. 2 is a schematic view of a photoresist nozzle device 50 and the coating apparatus A1 in accordance with some embodiments of the disclosure. The coating apparatus A1 includes a processing chamber A11 and a wafer chuck A12. The wafer chuck A12 is disposed in the processing chamber A11. A wafer W1 is disposed on the wafer chuck A12.

The photoresist nozzle device 50 is located in the processing chamber A11. The photoresist nozzle device 50 is configured to spurt the photoresist fluid L1 on the wafer W1. When the photoresist fluid L1 flows on the wafer W1, the wafer W1 is rotated by the wafer chuck A12, and the photoresist fluid L1 uniformly covers a top surface of the wafer W1.

The photoresist nozzle device 50 is coupled with the pump 40 via a fifth tube T5. The photoresist nozzle device 50 includes a nozzle 51 and a retaining element 52. The nozzle 51 is disposed on a bottom surface of the retaining element 52. The retaining element 52 has a retaining body 521, a channel 522, and a fastening element 523. The channel 522 is located in the retaining body 521. The channel 522 communicates with the nozzle 51 and the fifth tube T5. The fifth tube T5 is fixed on the retaining body 521 by the fasten element 523. In some embodiments, the fasten element 523 is a screw nut.

The fifth tube T5 is further connected to the second side 412 of the cylinder 41 as shown in FIG. 1. The photoresist fluid L1 in the cylinder 41 flows to the nozzle 51 via the fifth tube T5 and the channel 522. A seventh valve V7 as shown in FIG. 1 is disposed on the fifth tube T5. After the piston 42 pushes the photoresist fluid L1 to the nozzle 51 via the fifth tube T5, the seventh valve V7 is closed. Therefore, the photoresist fluid L1 in the nozzle 51 and the channel 522 is prevented from drawing back to the cylinder 41.

However, in some embodiments, the seventh valve V7 is closed after the pump 40 draws back a little bit of the photoresist fluid L1. As show in FIG. 2, the photoresist fluid L1 in the nozzle 51 is a distance from an exhaust opening 511. Therefore, the photoresist fluid L1 in the nozzle 51 is prevented from falling on the wafer W1 unexpectedly after the seventh valve V7 is closed.

In some embodiments, the channel 522 is an L-shaped structure. The channel 522 has a first straight segment 5221 and a second straight segment 5222. The first straight segment 5221 is parallel to a horizontal direction D2. The second straight segment 5222 is parallel to a vertical direction D1. A connection location 5223 of the first straight segment 5221 and the second straight segment 5222 is a 90-degree bend. Therefore, the photoresist fluid L1 flowing through the first straight segment 5221 and the second straight segment 5222 via the connection location 5223 is not smooth.

When the pump 40 draws back a little bit of the photoresist fluid L1 from the fifth tube T5, the hydraulic pressure of the photoresist fluid L1 at the connection location 5223 is decreased. Therefore, the gas dissolved in the photoresist fluid L1 is released and forms some bubbles B1. The bubbles B1 may fall down on the wafer W1 with the photoresist fluid L1 spurted from the nozzle 51. Some defects may be caused on the wafer W1 by the bubbles B1.

Figure 3:
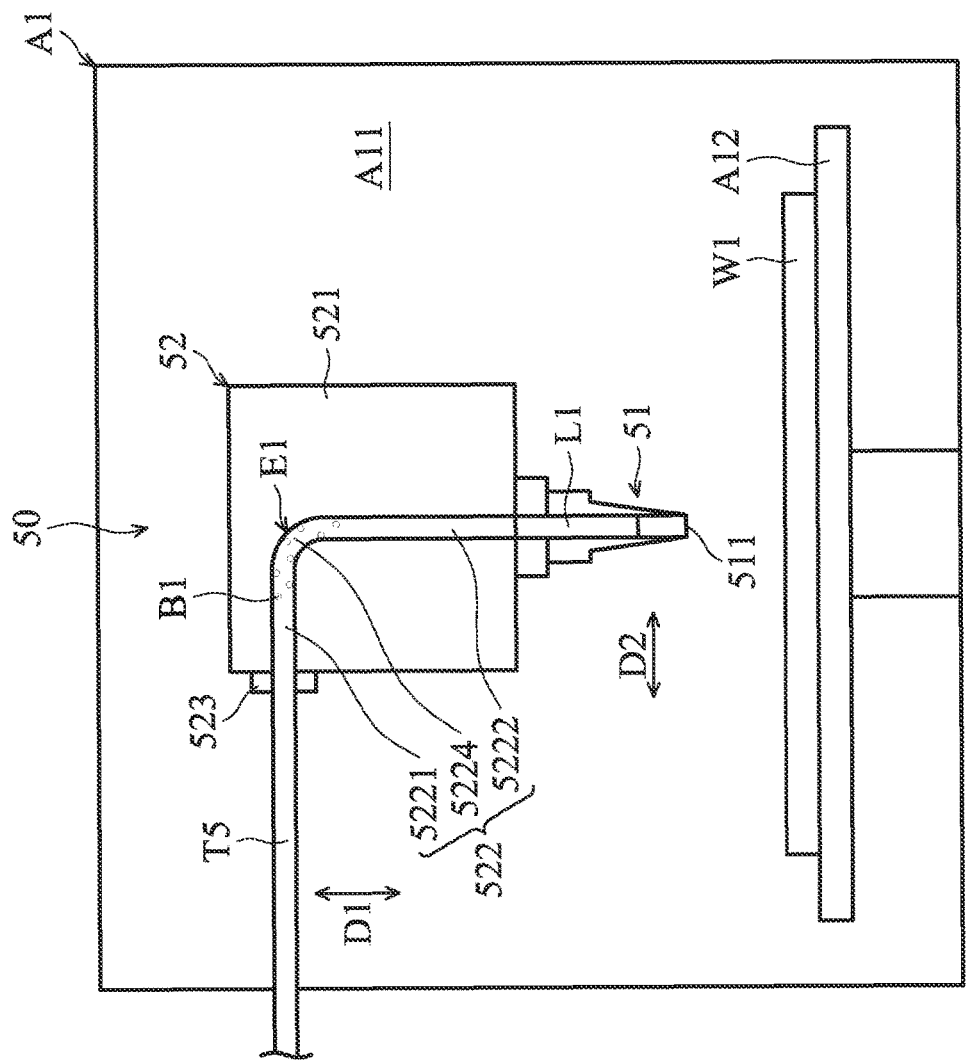
FIG. 3 is a schematic view of a photoresist nozzle device and a coating apparatus in accordance with some embodiments of the disclosure.

FIG. 3 is a schematic view of a photoresist nozzle device 50 and the coating apparatus A1 in accordance with some embodiments of the disclosure. As shown in FIG. 3, the channel 522 located in the retaining body 521 includes a first straight segment 5221, a second straight segment 5222, and a bend segment 5224.

In some embodiments, the bend segment 5224 has a diameter E1 in a range from about 1 cm to about 3 cm and a length in a range from about 2 cm to about 4 cm. The bend segment 5224 has a diameter E1 and a length about 1 to about 2 times longer than the diameter E1. In some embodiments, the curved segment 542 has a curvature in a range about 0.5 cm^−1 to about 1 cm^−1. Since the length is short, the photoresist fluid L1 flowing through the first straight segment 5221 and the second straight segment 5222 via the bend segment 5224 is still not smooth enough. Fewer bubbles B1 are still generated at the bend segment 5224.

In general, the fifth tube T5 is made of light shading materials to protect the photoresist fluid L1 in the fifth tube T5 from ambient light. The retaining element 52 is also made of light shading materials. However, the bubbles B1 located in the channel 522 cannot be inspected directly. Therefore, another embodiment is provided.

Figure 4:
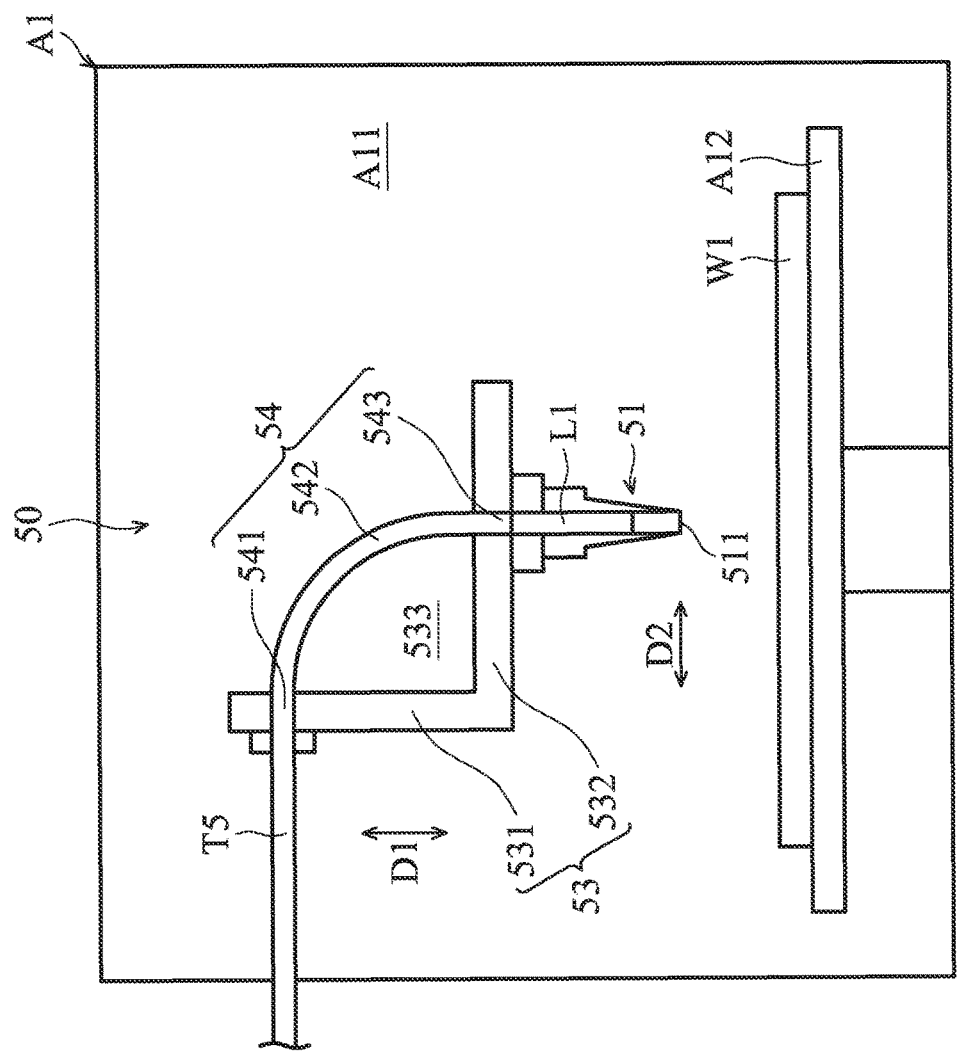
FIG. 4 is a schematic view of a photoresist nozzle device and a coating apparatus in accordance with some embodiments of the disclosure.
Figure 5:
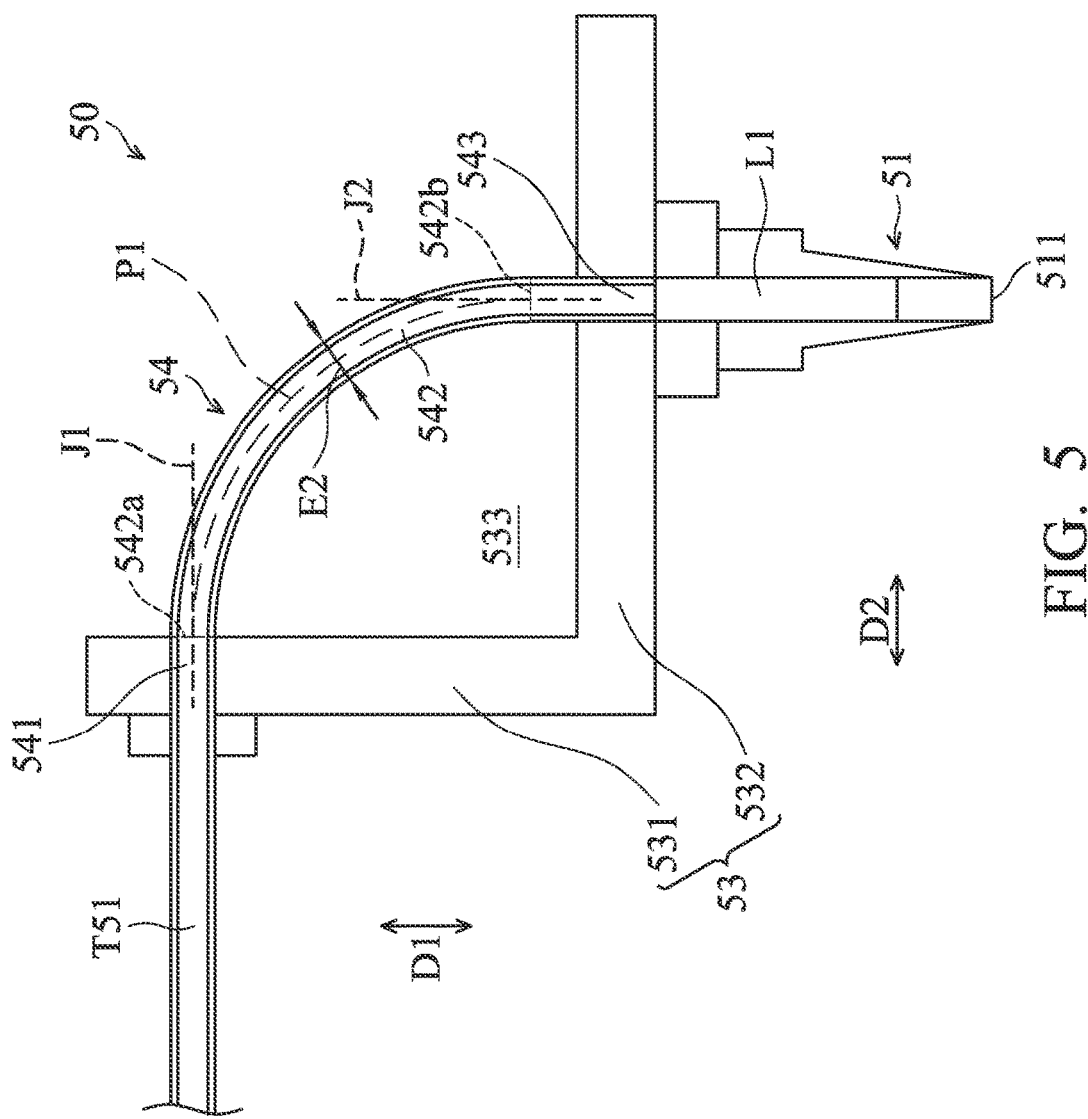
FIG. 5 is a schematic view of a photoresist nozzle device in accordance with some embodiments of the disclosure.

FIG. 4 is a schematic view of a photoresist nozzle device 50 and the coating apparatus A1 in accordance with some embodiments of the disclosure. FIG. 5 is a photoresist nozzle device 50 in accordance with some embodiments of the disclosure. The photoresist nozzle device 50 includes a nozzle 51, a retaining frame 53, and a tube 54. The nozzle 51, the retaining frame 53, and the tube 54 are located in the processing chamber A11. The nozzle 51 is disposed on a bottom surface of the retaining frame 53. The tube 54 is disposed on the retaining frame 53. The tube 54 communicates with the fifth tube T5 and the nozzle 51.

The retaining frame 53 further includes a first wall 531 and a second wall 532 connected to the first wall 531. The first wall 531 and the second wall 532 form a receiving groove 533. In some embodiments, the first wall 531 is substantially perpendicular to the second wall 532. The first wall 531 is substantially extended to the vertical direction D1, and the second wall 532 is substantially extended to the horizontal direction D2.

The tube 54 includes a first segment 541, a curved segment 542 and a second segment 543. The first segment 541 passes through the first wall 531. The curved segment 542 is connected to the first segment 541 and the second segment 543. The curved segment 542 is located in the receiving groove 533. The second segment 543 passes through the second wall 532. The second segment 543 is connected to the nozzle 51.

In some embodiments, the tube 54 is made of light transmissible materials. Since the curved segment 542 is uncovered by the retaining frame 53, the inner side of the curved segment 542 is directly inspected from the outside of the coating apparatus A1. Therefore, the photoresist fluid L1 in the photoresist nozzle device 50 may be inspected more frequently. If some bubbles B1 are generated in the tube 54, the bubbles B1 may be inspected and removed in a short time, and the defects of the wafer W1 caused by the bubbles B1 are decreased.

In some embodiments, as shown in FIG. 5, the first segment 541 is extended along the horizontal direction D2. The second segment 543 is extended along the vertical direction D1. The nozzle 51 is extended along the vertical direction D1.

In some embodiments, the curved segment 542 has an arc length in a range from about 5 cm to about 16 cm. For example, the arc length is about 7 cm. The curved segment 542 has a diameter E2 in a range from about 1 cm to about 5 cm. For example, the diameter E2 is about 2 cm. The arc length is about 2.5 to about 15 times longer than the diameter E2. For example, the arc length is about 3.5 times longer than the diameter E2.

In some embodiments, the curved segment 542 is extended along a circular path P1. The curved segment 542 has a radian about π/2 rad. In some embodiments, the curved segment 542 has a curvature in a range about 0.1 cm^−1 to about 0.4 cm^−1. For example, the curvature is about 0.3 mm^−1.

In some embodiments, the curved segment 542 has a first end 542a connected to the first segment 541 and a second end 542b connected to the second segment 543. The circular path P1 at the first end 542a has a first tangent line J1, and the first segment 541 is extended along the first tangent line J1. The circular path P1 at the second end 542b has a second tangent line J2, and the second segment 543 is substantially extended along the second tangent line J2.

By the structure of the curved segment 542, the photoresist fluid L1 flowing through the first segment 541 and the second segment 543 via the curved segment 542 is smooth. Therefore, the pressure in the curved segment 542 is not decreased greatly when some of the photoresist fluid L1 is drawn back to the cylinder 41. Bubbles B1 generated in the tube 54 are greatly decreased or omitted.

Embodiments of a photoresist supply system and a photoresist nozzle device are provided. A nozzle is configured to spurt a photoresist fluid on a wafer in a coating apparatus. A tube connected to the nozzle includes a curved segment. Therefore, the photoresist fluid flowing in the tube is smooth. Some bubbles generated in the tube by a pump drawing back the photoresist fluid is decreased or omitted. Furthermore, the tube is made of light transmissible materials. The photoresist fluid of the tube is inspected directly from the outside of the coating apparatus. Therefore, the photoresist fluid in the tube may be inspected frequently.

In some embodiments, a photoresist nozzle device is provided. The photoresist nozzle device includes a tube including a first segment, a curved segment connected to the first segment, and a second segment connected to the curved segment. The photoresist nozzle device also includes a nozzle connected to the second segment.

In some embodiments, a photoresist nozzle device for a coating apparatus is provided. The photoresist nozzle device includes a retaining frame having a receiving groove. The retaining frame is located in the coating apparatus. The photoresist nozzle device also includes a tube disposed on the retaining frame. The tube includes a first segment, a curved segment connected to the first segment and located in the receiving groove, and a second segment connected to the curved segment. The photoresist nozzle device further includes a nozzle connected to the second segment.

In some embodiments, a photoresist supply system is provided. The photoresist supply system includes a buffer tank containing a photoresist fluid and a pump coupled with the buffer tank, and receiving the photoresist fluid. The photoresist supply system also includes a tube including a first segment coupled with the pump, a curved segment connected to the first segment, and a second segment connected to the curved segment. The photoresist supply system further includes a nozzle connected to the second segment. The pump transfers the photoresist fluid to the nozzle via the tube.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A photoresist supply system, comprising:
   a retaining frame including:
      an L-shaped set of walls consisting of:
         a first wall having an outer surface and an opposing inner-surface that define a first thickness, the first wall extending in a substantially vertical direction; and
         a second wall having an outer surface and an opposing inner-surface that define a second thickness, the second wall extending in a substantially horizontal direction and wherein the second wall is directly connected to and extending from the first wall to form the L-shaped set of walls;
   a tube comprising a first segment, a curved segment connected to the first segment, and a second segment connected to the curved segment, wherein the curved segment of the tube is made of light transmissible materials and configured to permit a visual inspection; and
   wherein the curved segment has a diameter and an arc length 2.5 to 15 times longer than the diameter;
   a nozzle connected to the second segment of the tube and disposed on the outer surface of the second wall, wherein the nozzle extends in the substantially vertical direction terminating in an exhaust opening;
   and wherein the first segment of the tube traverses through the first thickness of the first wall, wherein the second segment of the tube traverses through the second thickness of the second wall, and wherein the curved segment is disposed in a gap defined by the first wall and the second wall of L-shaped set of walls.

2. The photoresist supply system as claimed in claim 1, wherein the first segment is extended along a horizontal direction, and the second segment is extended along a vertical direction.

3. The photoresist supply system as claimed in claim 1, wherein the curved segment is substantially extended along a circular path.

4. The photoresist supply system as claimed in claim 3, wherein the curved segment has a first end connected to the first segment and a second end connected to the second segment, and the circular path at the first end has a first tangent line, and the first segment is substantially extended along the first tangent line.

5. The photoresist supply system of claim 1, wherein the first thickness is substantially uniform from a first end mated with the second wall to a second terminating end of the first wall; and wherein the second thickness is substantially uniform from a first end mated with the first wall to a second terminating end of the second wall.

6. The photoresist supply system of claim 1, wherein the curved segment of the tube is uncovered.

7. A photoresist dispensing device, comprising:
   a retaining frame, having a vertically extending wall extending vertically from a first point to a second point and a horizontally extending wall extending horizontally from a third point to a fourth point, wherein the third point is directly connected to the first point of the vertically extending wall, wherein the second point and the fourth point define an endpoint of the vertically extending wall and the horizontally extending wall respectively, wherein the vertically extending wall and the horizontally extending wall define a receiving groove a first edge of which is defined by the vertically extending wall and a second edge of which is defined by the horizontally extending wall;

wherein the retaining frame consists of the vertically extending wall and the horizontally extending wall;

a tube, disposed on the retaining frame and wherein the tube includes a first segment, a curved segment connected to the first segment and located in the receiving groove, and a second segment connected to the curved segment, wherein the first segment passes through the vertically extending wall a portion of the vertically extending wall disposed on both sides of the first segment the first point disposed on a first side of the first segment and the second point disposed on a second side of the first segment, and the second segment passes through the horizontally extending wall a portion of the horizontally extending wall disposed on both sides of the second segment, the third point disposed on a first side of the second segment and the fourth point disposed on a second side of the second segment, wherein the first segment of the tube is at substantially a right angle relative to a respective plane of the vertically extending wall, and the second segment is at substantially a right angle relative to a respective plane of the horizontally extending wall; and wherein the curved segment has a diameter and an arc length 2.5 to 15 times longer than the diameter;

a nozzle connected to the second segment of the tube and the nozzle disposed directly on a bottom surface of the horizontally extending wall between the third point and the fourth point, wherein the curved segment of the tube is made of light transmissible materials and configured to permit a visual inspection within the receiving groove.

8. The photoresist dispensing device as claimed in claim 7, wherein the first segment is extended along a horizontal direction, and the second segment is extended along a vertical direction.

9. The photoresist dispensing device as claimed in claim 7, wherein the curved segment is substantially extended along a circular path.

10. A photoresist supply system, comprising:
a buffer tank containing a photoresist fluid;
a pump coupled with the buffer tank, and receiving the photoresist fluid from the buffer tank;
a tube comprising a first segment coupled with the pump, a curved segment connected to the first segment, and a second segment connected to the curved segment;
wherein the curved segment has a diameter and an arc length 2.5 to 15 times longer than the diameter;
an L-shaped retaining frame holding the tube wherein the L-shaped retaining frame consists of a first wall and a second wall perpendicular to the first wall, connected to the first wall, and extending from the first wall, the first segment of the tube passing through the first wall and the second segment of the tube passing through the perpendicular second wall;
a gas pump transferring a gas into the buffer tank, wherein a pressure in the buffer tank is increased by the gas, and a portion of the photoresist fluid is exhausted from the buffer tank to the pump by the pressure; and
a nozzle connected to the second segment of the tube and being disposed directly on a surface of the second wall, wherein the pump transfers the photoresist fluid to the nozzle via the tube;
wherein the curved segment of the tube is uncovered with respect to the L-shaped retaining frame, made of light transmissible materials and configured to permit a visual inspection.

11. The photoresist supply system as claimed in claim 10, further comprising a photoresist container coupled with the buffer tank and transferring the photoresist fluid to the buffer tank.

12. The photoresist supply system as claimed in claim 10, wherein the curved segment is extended along a circular path.

* * * * *